United States Patent [19]
Ozawa

[11] Patent Number: 5,808,872
[45] Date of Patent: Sep. 15, 1998

[54] SEMICONDUCTOR PACKAGE AND METHOD OF MOUNTING THE SAME ON CIRCUIT BOARD

[75] Inventor: Atsushi Ozawa, Tokyo, Japan

[73] Assignee: Nippon Steel Corporation, Tokyo, Japan

[21] Appl. No.: 558,082

[22] Filed: Nov. 13, 1995

[30] Foreign Application Priority Data

Nov. 15, 1994 [JP] Japan ..................................... 6-305573
Nov. 15, 1994 [JP] Japan ..................................... 6-305574

[51] Int. Cl.$^6$ ..................................................... H05K 1/14
[52] U.S. Cl. .......................... 361/760; 361/748; 361/751; 361/764; 257/684; 257/690; 257/780; 257/784
[58] Field of Search .................................. 361/760, 748, 361/750, 751, 761, 762, 764, 777, 737, 738, 813; 257/684, 690, 778, 786, 692, 777, 779, 780, 784, 668, 676, 693, 697; 438/107, 108, 109

[56] References Cited

U.S. PATENT DOCUMENTS

| | | | |
|---|---|---|---|
| 4,942,454 | 7/1990 | Mori et al. | 257/676 |
| 5,594,275 | 1/1997 | Kwon et al. | 257/686 |
| 5,627,405 | 5/1997 | Chillara | 257/668 |

OTHER PUBLICATIONS

Standards of Electronic Industries Association of Japan, ED–7402–1, General Rules For Preparation Of Outline Drawings Of Integrated Circuits, Small Outline Package, Feb. 1989.

Standards of Electronic Industries Association of Japan, ED–7402–4A, General Rules For The Preparation Of Outline Drawings Of Integrated Circuits Thin Small Outline Packages (Type II), Feb. 1990.

*Primary Examiner*—Leo P. Picard
*Assistant Examiner*—David Foster
*Attorney, Agent, or Firm*—Law Offices Pollock, Vande Sande & Priddy

[57] ABSTRACT

A semiconductor package includes a semiconductor chip having a plurality of electrodes on a main surface thereof, and a package substrate having first and second parallel surfaces, wherein the package substrate is fixed to the semiconductor chip in such a positional relationship that the main surface of the semiconductor chip faces the first surface, and has substantially the same size as a size of the semiconductor chip as viewed on a projection plane vertical to the first surface, and wherein the package substrate has a passage extending between the first and the second surfaces for electrically connecting the electrodes of the semiconductor chip to predetermined portions of the circuit board. A method of mounting the above-mentioned semiconductor package to the circuit board comprises electrically connecting the electrodes of the semiconductor chip to predetermined portions of the circuit board by bonding wires or bumps, through the passage provided to the semiconductor package.

22 Claims, 7 Drawing Sheets

SEMICONDUCTOR PACKAGE AND METHOD OF MOUNTING THE SAME ON CIRCUIT BOARD

BACKGROUND OF THE INVENTION

1. Field of the Invention

This invention relates to a semiconductor package and a method of mounting it on a circuit board. More particularly, the present invention relates to a semiconductor package using a package substrate and a method of mounting it on a circuit board.

2. Description of the Related Art

A semiconductor package mechanically reinforces a semiconductor chip and protects it from external conditions, such as humidity, as well known in the art. To facilitate mounting of the semiconductor package to a circuit board, electrodes of the semiconductor chip are electrically connected to external leads and then, generally, the semiconductor chip is wholly resin-molded. The demand for a smaller size has been rapidly increasing in semiconductor packages of such type.

As the package forms there exist a thin SSOP (Shrink Small Outline Package) and a thin SQFP (Shrink Quad Flat Package) as described, for example, in "General Rules for Preparation of Outline Drawings of Integrated Circuits; Small Outline Package" edited in February, 1989 by Semiconductor Outline Committee and in "Thin Small Outline Package (Type II)", General Rules, edited in February, 1990. As one of the examples of packaging structures, there exists a so-called "LOC" (Lead On Chip) wherein the tips of leads are fixed on a semiconductor chip and the leads are connected to the electrodes by bonding wires on the chip. In these structures, the reduction of the size of mold package is considered as having nearly reached its limit. Nonetheless, even in the thin SOP having the LOC structure, the volume of the semiconductor chip is about 24% at most of the mold portion (an area occupying ratio=80%, a thickness occupying ratio=30%).

Further, the mold package of the prior art is poor in heat radiation property. Even in case of the QFP (42 alloy leads, 100 pins, ordinary mold structure as mounted to substrate, at no air flow), which is generally excellent in heat radiation property, a thermal resistance θja is as high as θja=90° C./W. Therefore, many studies have been made recently on the materials of the lead and the molding resin, provision of structures heat radiation plates, and so forth.

Recently, an MCM (Multiple Chip Module), in which a plurality of bare chips are mounted on a high density wiring board, attracted great attention as a mounting technology useful in high speed operation and reduction of size. Because this MCM uses the bare chips, it is more advantageous in reduction of the size and the heat radiation property than the mold package as described above.

In the MCM, however, it is essential that all the bare chips as mounted are products (so-called "known good having good dies") having good characteristics, including reliability. However, because evaluation of the characteristics or reliability of the bare chip requires handling of the semiconductor chip itself, it involves various problems such as breakage of the semiconductor chip and breakage of the circuits on its surface during handling.

As described above, in the semiconductor package of the prior art, the reduction of the size has almost reached its limit and the problem of thermal resistance is high has not been solved. On the other hand, in the case of, for example, the MCM using bare chips, further development of the technology of "known good die" is required.

SUMMARY OF THE INVENTION

It is an object of the present invention to provide a semiconductor package which has substantially the same size as that of a semiconductor chip, and is excellent in heat radiation property and handling property, and to provide a method of mounting the same to a circuit board.

A semiconductor package according to the present invention includes a semiconductor chip having a plurality of electrodes on a main surface thereof; and a package substrate having first and second parallel surfaces, and fixed to the semiconductor chip in such a positional relationship that the main surface of the semiconductor chip faces the first surface, wherein the package substrate has substantially the same size as the size of the semiconductor chip as projected on a plane vertical to the first surface; and includes means for providing a passage extending between the first and second surfaces through which the electrodes of the semiconductor chip are electrically connected to predetermined portions of a circuit board.

A semiconductor package according to a first preferred embodiment of the present invention comprises a semiconductor chip having a plurality of electrodes on a main surface thereof; a package substrate having first and second parallel surfaces, first electrode portions disposed on the first surface corresponding to the electrodes of the semiconductor chip and second electrode portions disposed on the second surface and electrically communicating with the first electrode portions, respectively. The package substrate is fixed to the semiconductor chip in a positional relationship such that the main surface of the semiconductor chip faces the first surface and has substantially the same size as the size of the semiconductor chip as projected on a plane vertical to the first surface. Bumps are disposed between the electrodes of the semiconductor chip and the first electrode portions corresponding thereto, respectively, for bonding them together.

A method of mounting the semiconductor chip described above to the circuit board according to the present invention comprises the steps of fixing the package substrate and the circuit board in such a positional relationship that the second surface of the package substrate faces one of the surfaces of the circuit board; and electrically connecting the second electrode portions to predetermined portions on one of the surfaces of the circuit board.

A semiconductor package according to another embodiment of the present invention comprises a semiconductor chip having a plurality of electrodes on a main surface thereof; and a package substrate having first and second parallel surfaces and a plurality of openings formed correspondingly to the electrodes of the semiconductor chip, respectively, to extend between the first and second surfaces. The package substrate is fixed to the semiconductor chip in such a positional relationship that the main surface of the semiconductor chip faces the first surface and the electrodes of the semiconductor chip are exposed inside the openings, and have substantially the same size as the semiconductor chip.

A method of mounting the semiconductor chip described above to the circuit board according to the present invention comprises the steps of fixing a rear surface of the semiconductor chip opposite to the main surface to the circuit board; and electrically connecting the electrodes of the semiconductor chip exposed inside the openings of the package substrate to predetermined portions of the circuit board.

Since the semiconductor package according to the present invention has the construction described above, the package substrate is fixed on the semiconductor chip by bonding the first electrode portions of the package substrate to the electrodes of the semiconductor chip through the bumps, and the second electrode portions electrically communicating with the first electrode portions of the package substrate function as external connection portions at the time of wire bonding or bump bonding to the circuit board. The package substrate on the semiconductor chip mechanically reinforces the semiconductor chip and protects its surface. Therefore, it is possible to provide a package having substantially the same size as the size of the semiconductor chip as projected on a plane.

When mounting is made by a mold package, the package bottom portion of the chip is above the circuit board. Therefore, the heat of the chip is transmitted to the circuit board through the leads of the package. In the present invention, however, one of the surfaces of the chip is in contact with the circuit board throughout its entire surface, so that the heat radiation property is greatly improved. Further, when the outer periphery of at least a gap between the semiconductor chip and the package substrate is molded by a resin, the overall strength of the package can be improved and protect more effectively from the external environment, such as humidity.

Moreover, the semiconductor package can be easily handled by vacuum-attraction, for example, without directly touching the semiconductor chip itself. Accordingly, the evaluation of characteristics and reliability can be carried out without damage of the semiconductor chip and breakage of the surface circuits, and hence the selection of bare chips for the MCMs, for example, can be easily conducted.

DESCRIPTION OF THE PREFERRED EMBODIMENTS

The first embodiment of the present invention will now be described with reference to the drawings.

Figure 1:
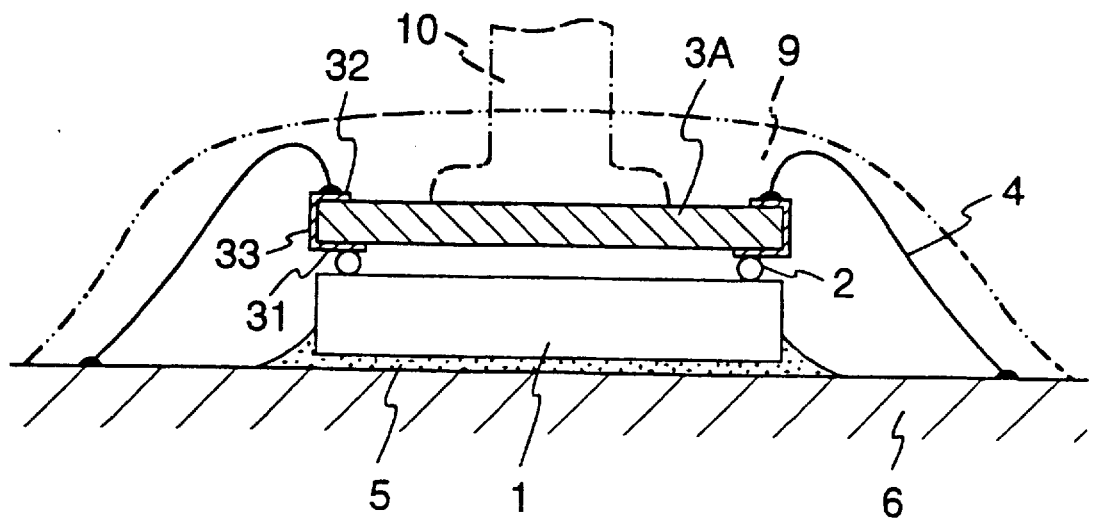
FIG. 1 is a sectional view showing a semiconductor package according to a first embodiment of the present invention is mounted to a circuit board.

First, FIG. 1 shows the first embodiment. Reference numeral 1 denotes a semiconductor chip; 2 is a bump; 3A is a package substrate; 4 is a bonding wire; 5 is a die bonding material; and 6 is a circuit board. This semiconductor package is formed by disposing a package substrate 3A on the semiconductor chip 1, and will be hereinafter referred to as a "CCP" (Capped Chip Package).

A plurality of electrodes (not shown) are arranged along and near the outer periphery of the surface of the semiconductor chip 1. The electrodes may be disposed in the inner area of the surface.

The package substrate 3A is formed in a rectangular plate of an insulating material such as an epoxy resin, and has substantially the same size as that of the semiconductor chip as viewed on a vertical projection plane. First electrode portions 31 are disposed on the rear surface of the package substrate 3A correspondingly to the electrodes of the semiconductor chip 1, and second electrode portions 32 are disposed on its main surface. The first and second electrode portions 31 and 32 are connected to each other through connection portions 33 formed to extend between the main surface and the rear surface of the package substrate 3A around its outer peripheral edge. These electrode portions 31, 32 and connection portions 33 can be integrally formed into a pattern of conductive material by etching or plating, and particularly when plating is employed, it is advisable to make the package substrate 3A out of a plastic material which can be plated.

The electrode portions 31, 32 and the connection portion 33 are made of a conductor having a three-layered structure made by sequentially depositing Cu, Ni and Au on the package substrate, for example.

This CCP can be assembled in the following way. First, the bump 2 is temporally fitted to the electrode of the semiconductor chip 1, and then the package substrate 3A is positioned relative to the semiconductor chip in such a manner that the bump 2 comes into contact with the electrode portion 31 of the package substrate 3A. Next, both of the package substrate and the semiconductor chip are heated under compressive pressure so as to melt the bump 2 and to bond the electrode of the semiconductor chip 1 to the first electrode portion 31 of the package substrate 3A. As a result, the semiconductor chip 1 can be mechanically fixed to the package substrate 3A and each electrode can be electrically connected to the first electrode portion 31. Alternatively, the bump 2 may first be bonded to the first electrode portion 31 of the package substrate 3A. A wafer bump formed on the electrode of the semiconductor chip 1 at a wafer stage or a ball bump of post-bonding can be used as this bump 2, and the bump may be made of a material such as Au, Cu and Pb-Sn.

Next, in mounting this CCP to the circuit board 6, the rear surface of the semiconductor chip 1 is die-bonded to the circuit board 6 by using a die-bond material 5, such as an Ag paste, or by eutectic bonding between Au on the rear surface of the chip and the plating material on the surface of the substrate. Next, the second electrode portions 32 on the surface of the package substrate 3A are connected to predetermined connection portions on the circuit board 6 by bonding wires 4 such as Au or Al.

In this CCP, the second electrode portion 32 of the package substrate 3A fixed on the semiconductor chip 1 serves as an external connection portion when wire bonded to the circuit board 6, and the package substrate 3A fixed to the semiconductor chip 1 mechanically reinforces the semiconductor chip 1 and protects the chip surface. Consequently, very small packaging, which has a size substantially equal to the size of the semiconductor chip 1 as projected on a lane, can be accomplished. Incidentally, the thickness of the package substrate 3A is almost equal to, or at most twice as large as the thickness of the semiconductor chip 1 (generally, 0.4 mm). Since the height of the bump 2 is on the order of tens of microns ($\mu$m), the overall thickness of the CCP, therefore, is almost equal to, or smaller than, the thickness of the mold packages of the prior art.

In this embodiment, the rear surface of the semiconductor chip 1 keeps contact with the circuit board 6 at its entire surface through the die bond material 5. Accordingly, the heat generated in the semiconductor chip 1 is directly transmitted to the circuit board 6 through the die bond material, so that the heat radiation property can be greatly improved. Particularly when packaging by die bonding and wiring as in this embodiment, an excellent heat radiation property (for instance, thermal resistance $\theta$ja=10° C./W) substantially equal to that of a bare chip is expected. After the semiconductor chip 1 is mounted to the circuit board 6 in this way, the semiconductor package is preferably molded as a whole by a potting resin 9, for example, so as to mechanically protect the bonding wires 4.

Furthermore, the CCP can be easily handled in the same way as ordinary mold packages by vacuum-attracting and holding the package substrate 3A by a collet 10, for example, as shown by an imaginary line in FIG. 1, without touching the semiconductor chip 1 itself. In this way, evaluation of the characteristics and reliability can be carried out without inviting damage to the semiconductor chip 1 and scratches to the surface circuit, and the bare chip selection for the MCMs, which are advantageous in high speed operation and reduction of size, for example, can be easily made.

Figure 2:
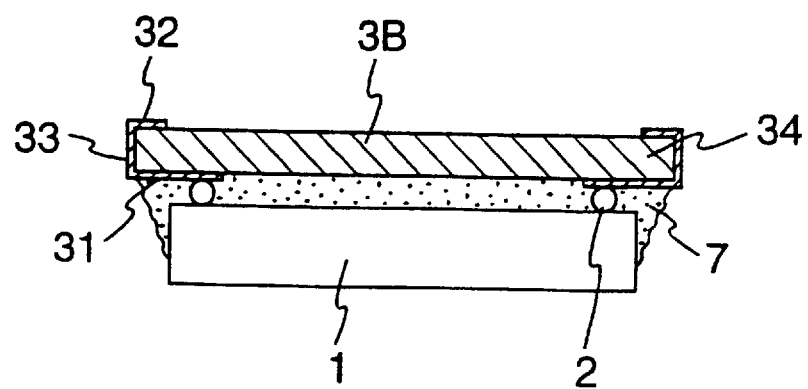
FIG. 2 is a sectional view of a semiconductor package according to a second embodiment of the present invention.

Next, FIG. 2 shows the second embodiment. The assembly method of the CCP is the same as that of the first embodiment. However, the gap between the semiconductor chip 1 and the package substrate 3B and the side surfaces of the semiconductor chip 1 inclusive of the outer periphery of the gap are molded by an epoxy or silicone resin 7. This package substrate 3B is formed to have a size slightly larger, so that the outer peripheral portion 34 of the package substrate 3B protrudes outward the side surface of the semiconductor chip 1 by, for example, 1~2 mm.

When molding by the potting resin 7 in this embodiment, the resin 7 is cured with the surface of the package substrate 3B facing down, in order to prevent the resin 7 from flowing to the rear surface of the semiconductor chip 1 thereby improving the heat radiation property. At this time, the outer peripheral portion 34 of the package substrate 3B prevents flow-down of the resin 7.

As described above, the mechanical strength of the CCP can be improved as a whole by resin-molding the outer periphery of at least the gap between the semiconductor chip 1 and the package substrate 3B, preferably, additionally the gap between the semiconductor chip 1 and the package substrate 3B, and the surface circuit of the semiconductor chip 1 and the joint portions can be effectively protected from the external environment, such as moisture. Incidentally, when the outer peripheral portion 34 of the package substrate 3B is made larger than the semiconductor chip 1 as in this embodiment, the outer peripheral edge of the package substrate 3B can be gripped when the CCP is handled.

Figure 3:
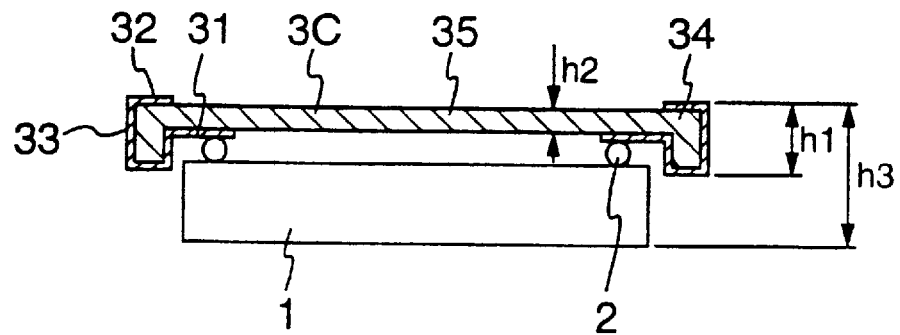
FIG. 3 is a sectional view of a semiconductor package according to a third embodiment of the present invention.

Next, FIG. 3 shows the third embodiment. The assembly method of the CCP is the same as that of the first embodiment, but in this package substrate 3C, its area surface is formed with a recess. In other words, the thickness $h_1$ of the outer peripheral portion 34, which protrudes outward the side surfaces of the semiconductor chip 1, is greater towards the rear side than the thickness $h_2$ of the portion 35 facing the semiconductor chip 1.

In comparison with the planar package substrate 3A shown in FIG. 1, therefore, the overall height $h_3$ of the CCP can be reduced without lowering its strength when making the thickness $h_2$ of the portion 35 smaller than the thickness of the package substrate 3A. When the thickness $h_2$ of the portion 35 is made equal to the thickness of the package substrate 3A, higher strength can be obtained for the CCP having the same height.

Figure 4:
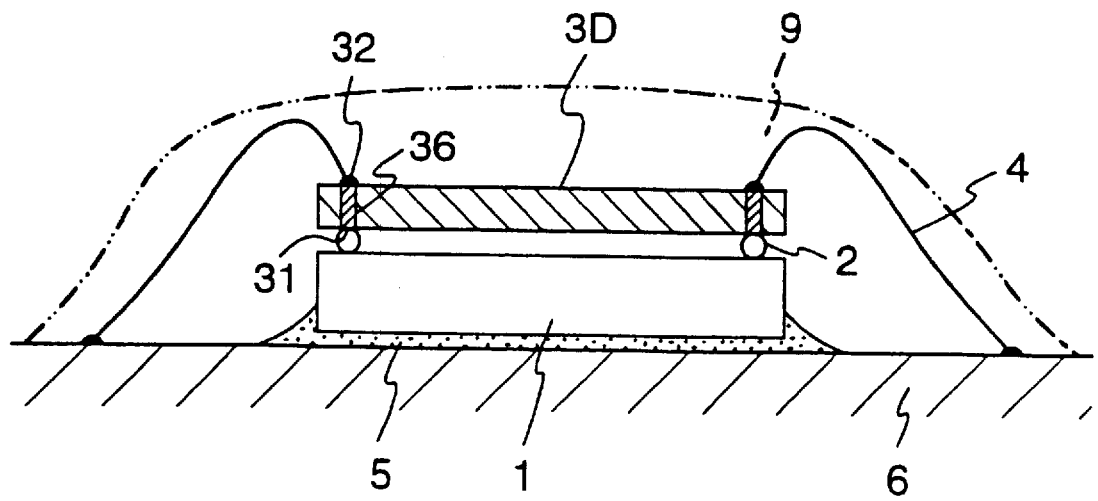
FIG. 4 is a sectional view showing a semiconductor package according to a fourth embodiment of the present invention mounted to a circuit board.

FIG. 4 shows the fourth embodiment. The assembly method of the CCP is the same as that of the first embodiment, but the package substrate 3D in this embodiment has through-holes 36 at positions corresponding to the electrodes of the semiconductor chip 1. In this embodiment, the first electrode portion 31 and the second electrode portion 32 are formed at the lower and upper ends of the through-hole 36, and the bonding wire 4 and the bump 2 are directly bonded to the upper and lower ends of the conductor extending through the through-hole 36.

When the electrical conduction between the first electrode portion 31 and the second electrode portion 32 is established through the through-hole 36, the package substrate 3D can be made easier than the package substrate 3A wherein the electrical conduction between the electrode portions 31 and 32 is established by the connection portion 33 extending around the outer periphery. The package substrate 3D and the semiconductor chip have substantially the same size as projected on a vertical plane.

Figure 5A:
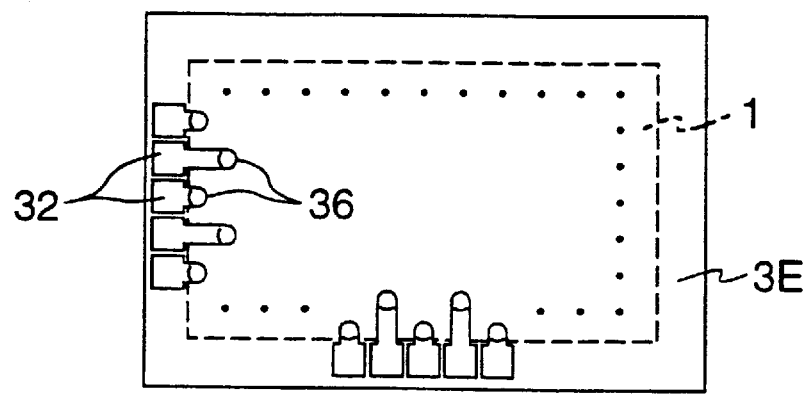
FIGS. 5A and 5B are a plan view and a sectional view of a semiconductor package according to a modified embodiment of the fourth embodiment.
Figure 5B:
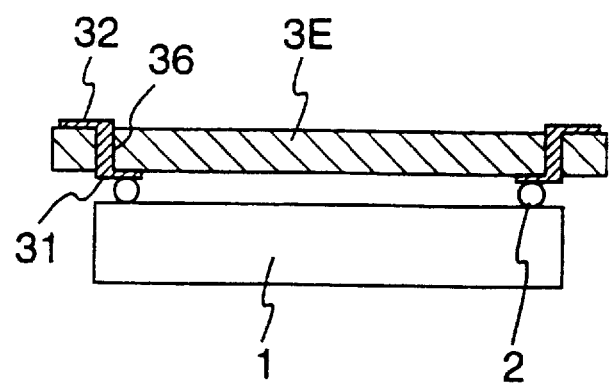

FIGS. 5A and 5B show a modification of the package substrate having the through holes. As shown in FIG. 5B, the first and second electrode portions 31 and 32 are formed in a pattern of conductive material by plating, for example, extending between the upper and lower ends of each through-hole 36. When this arrangement is employed, the first electrode portions 31 on the rear surface can be easily connected to the second electrode portions on the main surface even with a small pitch therebetween by mutually deviating the positions of the adjacent through-holes 36 as shown in FIG. 5A. Consequently, the package substrate 3E can be efficiently provided to the semiconductor chip 1 having a large number of electrodes disposed with a small pitch.

In the case of the package substrates 3B and 3C having the large or thick outer peripheral portion 34 as shown in FIGS. 2 and 3, the thorough-holes 36 as shown in FIGS. 4 and 5A are preferably employed because the connection portions 33 at the outer peripheral edge can be eliminated. The package substrate 3D or 3E having no connection portion 33 at the outer peripheral edge thereof is also preferred when the outer peripheral edge is gripped.

Figure 6A:
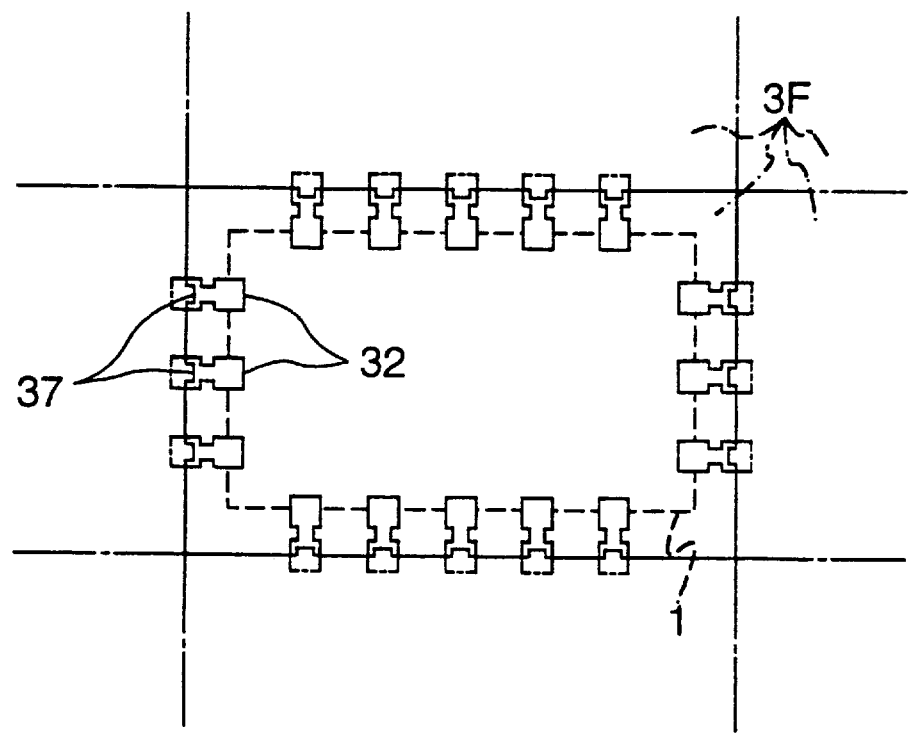
FIGS. 6A and 6B are a plan view and a sectional view of a semiconductor package according to another modified embodiment of the fourth embodiment.
Figure 6B:
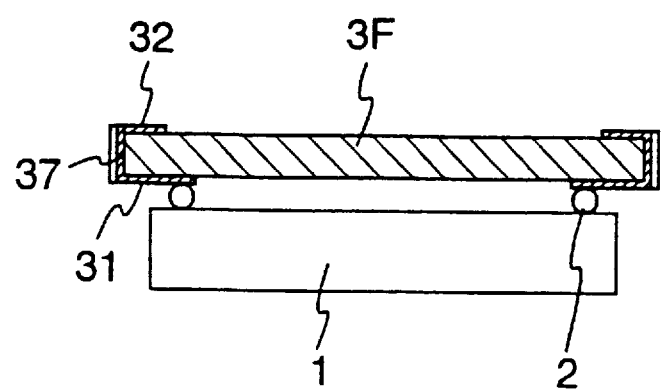

FIGS. 6A and 6B show another modification. In this package substrate 3F, the through-holes 37 are formed at its outer peripheral edge. Thus, a plurality of package substrates 3F are obtained from a large sheet-like plate as shown in FIG. 6A, and the through-holes 37 are formed in advance along cut lines of each package substrate 3F. Accordingly, when each package substrate 3F is cut and separated, groove-like through-holes 37 are formed at the outer peripheral edge of each package substrate 3F as shown in FIG. 6B, and the first electrode portion 31 and the second electrode portion 32 are connected through each groove 37.

Figure 7:
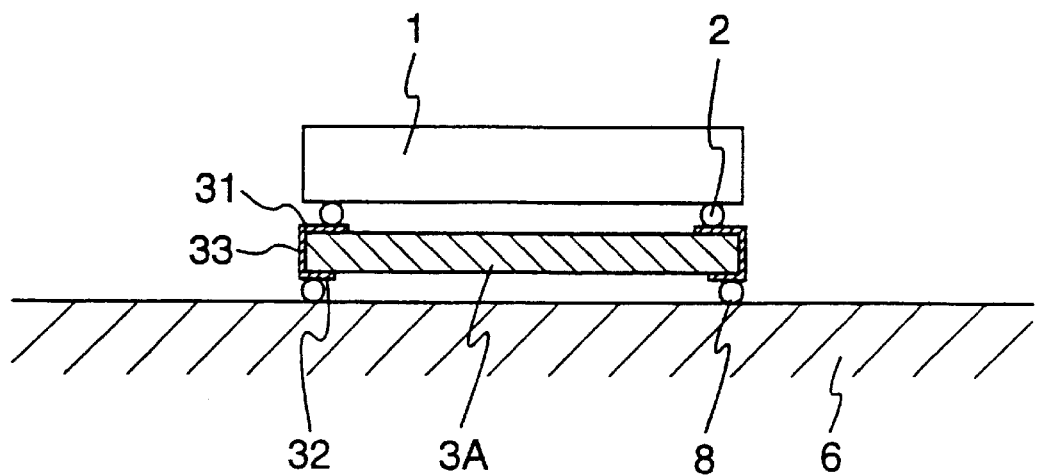
FIG. 7 is a sectional view showing a semiconductor package according to the fifth embodiment of the present invention mounted to a circuit board.

Next, FIG. 7 shows another mounting method of the CCP according to the fifth embodiment. The assembly method of the CCP is the same as that of the first embodiment, but the mounting to the circuit board 6 does not use the bonding wires 4 but relies on the bumps 8. In other words, the bump 8 is connected to the second electrode portion 32 on the main surface of the package substrate 3A. The package substrate 3A is then arranged so that its main surface is facing the circuit board 6, and the second electrode portion 32 is connected to a predetermined connection portion of the circuit board 6 through the bump 8. Here, the bump 8 used for bonding the second electrode 32 to the circuit board 6 has a melting point lower than the melting point of the bump 2 used for bonding the semiconductor substrate 1 to the package substrate 3A.

This mounting method is advantageous in that the occupying area of the CCP as mounted is substantially the same as that of the semiconductor chip 1, and, particularly in the MCM, the overall size can be further reduced by high density mounting of the CCPs.

Figure 8:
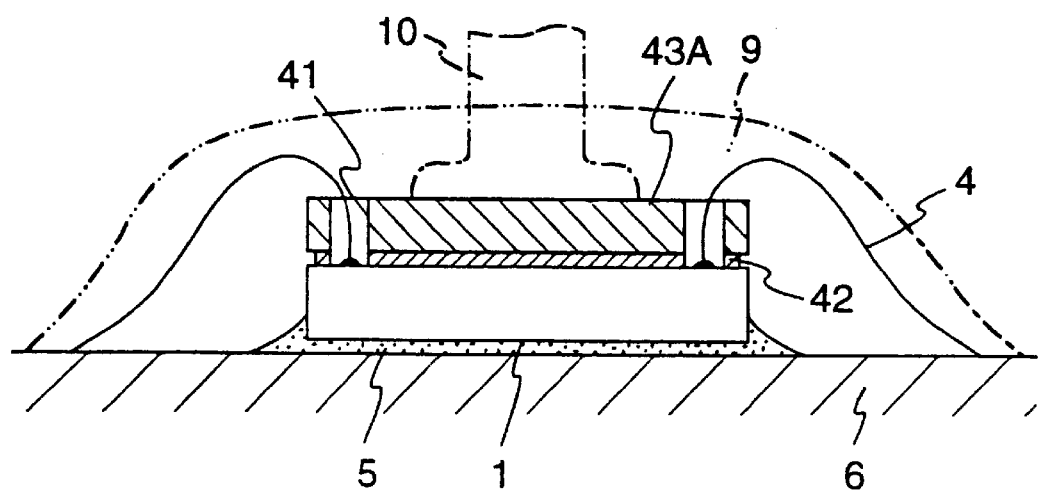
FIG. 8 is a sectional view showing a semiconductor package according to a sixth embodiment of the present invention mounted to a circuit board.

Next, FIG. 8 shows the sixth embodiment. Reference numeral 1 denotes a semiconductor chip; 42 is a bonding layer; 43A is a package substrate; 4 is a bonding wire; 5 is a die bond material; and 6 is a circuit board.

A plurality of electrodes (not shown) are disposed on the semiconductor chip 1 along and near the outer periphery of its surface. Incidentally, the electrodes may be disposed in the inner area of the surface.

The package substrate 43A is formed into a flat rectangular plate of an insulating material, such as an epoxy resin, having substantially the same size as that of the semiconductor chip 1 as projected on a vertical plane. Openings 41 are formed on the package substrate 43A correspondingly to the electrodes of the semiconductor chip 1. Each opening 41 has a size such that it can encompass the electrode of the semiconductor chip 1 and a distal end of a bonding tool can be inserted into it when wire bonding as discussed below.

Figure 9A:
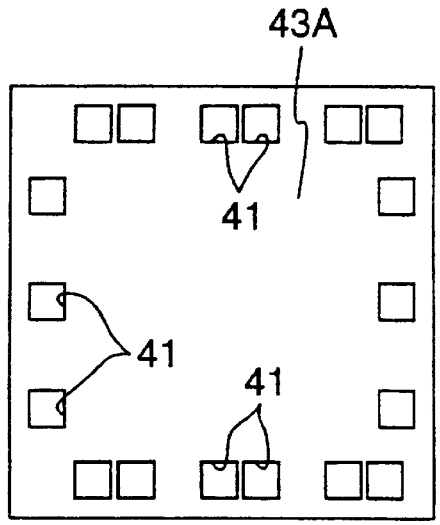
FIGS. 9A, 9B and 9C are plan views showing three examples of the openings formed in the package substrate in the sixth embodiment.
Figure 9B:
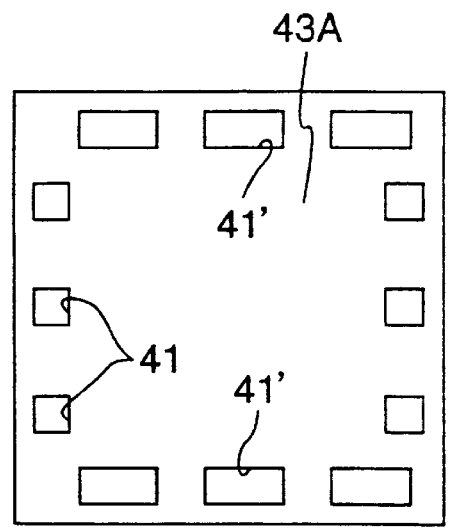

FIG. 9A is a plan view of an example of the package substrate. The openings 41 are formed in such a manner that each opening corresponds to one of the electrode pads of the semiconductor chip 1. FIG. 9B is a plan view of another example of the package substrate 43A. Besides the openings 41 each corresponding to one of the electrode pads, elongated hole-like openings 41' are formed so as to encompass a plurality of adjacent electrode pads. According to this arrangement, the opening 41' can be easily formed for the electrode pads of the semiconductor chip 1 having a small pitch, and wire bondings inside each opening 41' can be easily connected.

Figure 9C:
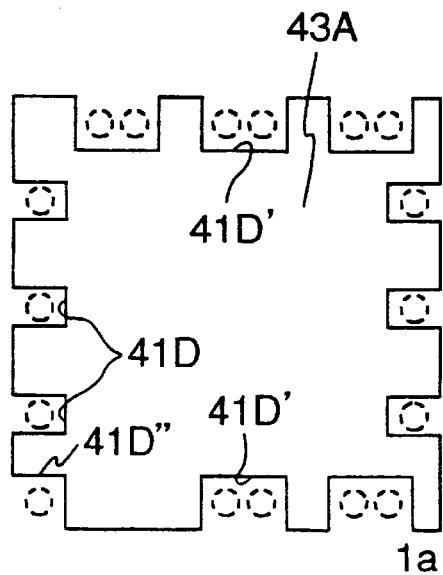

FIG. 9C is a plan view showing a third example of the package substrate. In FIGS. 9A and 9B, each of the openings 41, 41' is formed as a hole, whose entire periphery is encompassed by the material of the package substrate. But in this example, at least one of the sides of each of the openings 41D, 41D', 41D" is an open side. In other words, the openings are notch-like openings. The opening 41D is a notch for one electrode pad, and the opening 41D' is a notch for two electrode pads. Further, the opening 41D" is a notch disposed at a corner, and its two sides are open. By using the notch-like openings, the openings can be formed more easily.

Incidentally, the adhesive layer 42 is made of a material having an insulating property, a heat resistance to a temperature of about 240° C. at which the package is heated when mounted to the circuit board, and a low impurity concentration. A polyimide type adhesive or an adhesive sheet is preferably used, for example.

This CCP is assembled in the following way. First, the adhesive layer 42 is applied or attached to the portion of the surface of the semiconductor chip 1 other than the electrodes or its inner area. Next, the electrodes of the semiconductor chip 1 are positioned relative to the openings 41 of the package substrate 43A and the semiconductor chip 1 and the package substrate 43A are fixed to each other through the adhesive layer 42. In this way, the semiconductor chip 1 is mechanically fixed to the package substrate 43A and each electrode is exposed inside each opening 41. Incidentally, the adhesive layer 42 may be first applied or attached to the rear surface of the package substrate 43A. For alignment of the semiconductor chip 1 with the package substrate 43A, coincidence at two locations between the center of the specific electrode pad and the center of the opening 31, for example, may be employed.

Next, this CCP is mounted to the circuit board 6 in the following way. First, the rear surface of the semiconductor chip 1 is die-bonded to the circuit board 6 by using a die-bond material such as an Ag paste or by eutectic bonding. Next, the electrodes of the semiconductor chip 1 exposed inside the openings 31 of the package substrate 3A are connected to predetermined connection portions on the circuit board 6 by bonding wires 4 of Au or Al.

According to this CCP, the electrodes of the semiconductor chip 1 exposed inside the openings 41 of the package substrate 43A fixed on the semiconductor chip 1 serve as the external connection portions at the time of wire-bonding to the circuit board 6, the package substrate 43A on the semiconductor chip 1 mechanically reinforces the semiconductor chip 1, and the chip surface is protected. Accordingly, very small packaging having a size almost equal to the size of the semiconductor chip 1 as projected on a plane can be accomplished. Incidentally, the thickness of the package substrate 43A is substantially equal to, or at most about twice as large as the thickness (ordinarily, 0.4 mm) of the semiconductor chip 1, and the adhesive layer 42 is thin. Therefore, the overall thickness of the CCP can be reduced to a value substantially equal to, or smaller than, the thickness of mold packages of the prior art.

Figure 10:
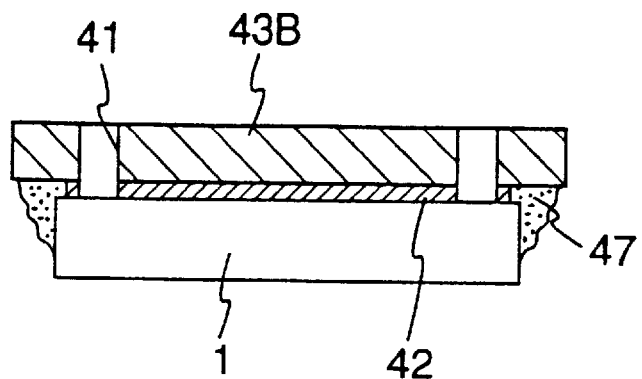
FIG. 10 is a sectional view of a semiconductor package according to a seventh embodiment of the present invention.

Next, FIG. 10 shows the seventh embodiment. The assembly method is the same as that of the sixth embodiment, but the side surface of the semiconductor chip 1 including the outer periphery of the gap between the semiconductor chip 1 and the package substrate 3B is molded by a resin in the same way as in the second embodiment. This package substrate 3B is formed into a somewhat larger size so that its outer peripheral portion 43 protrudes outward the side surface of the semiconductor chip 1 by 1 to 2 mm, for example.

Figure 11:
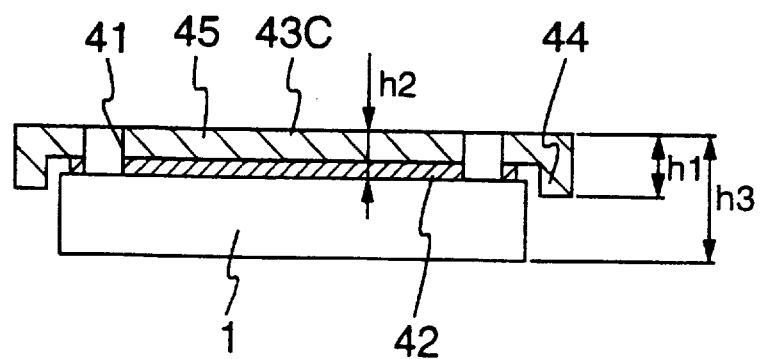
FIG. 11 is a sectional view of a semiconductor package according to an eighth embodiment of the present invention.

FIG. 11 shows the eighth embodiment. The assembly method of the CCP is the same as that of the sixth embodiment, but the rear surface of the package substrate 43C is formed with a recess in the same way as in the third embodiment. In other words, the thickness h1 of the outer peripheral portion 34 protruding outward the side surface of the semiconductor chip 1 is greater towards the rear surface than the thickness $h_2$ of a portion 35 facing to the semiconductor chip 1. Accordingly, this eighth embodiment provides the same effect as that of the third embodiment.

Though the present invention has thus been described with reference to the preferred embodiments thereof, it is not particularly limited to these embodiments but can be modified and changed variously and effectively on the basis of the technical concept of the invention. For instance, the shape of the package substrate, the electrical path between the first and second electrode portions in the package substrate, the structure of the openings, the resin molding portions, the mounting method of the semiconductor package, and so forth, can be combined in various ways with the constructions of the embodiments or with other effective constructions.

As described above, according to the present invention, the semiconductor package is obtained by fixing the package substrate on the semiconductor chip, and when mounting, the second electrode portions of the package substrate are connected to the circuit board through the bonding wires or the bumps, or the electrodes of the semiconductor chip exposed inside the openings of the package substrate are connected to the circuit board through the bonding wires. In this way, the present invention can obtain a very small semiconductor package having a size substantially equal to the semiconductor chip and moreover, having an excellent heat radiation property. Further, because the handling for bare chip selection is very easy, the present invention can effectively be applied to the MCMs, for example. When the electrodes of the semiconductor chip and the first electrode portions of the package substrate are connected by the bumps, mechanical fixing and electrical connection between the semiconductor chip and the package substrate can be conducted very easily and reliably by one assembly step.

I claim:

1. A semiconductor package comprising:
    a semiconductor chip having a plurality of electrodes on a main surface thereof; and
    a package substrate having first and second parallel surfaces and fixed to said semiconductor chip in such a positional relationship that said main surface of said semiconductor chip faces said first surface, said package substrate having substantially the same size as a size of said semiconductor chip as projected on a plane vertical to said first surface;
    said package substrate including means for providing an electrical path extending between said first surface and said second surface for electrical connection between said electrodes of semiconductor chip and predetermined portions of a circuit board.

2. A semiconductor package comprising:
    a semiconductor chip having a plurality of electrodes on a main surface thereof;
    a packaging substrate having first and second parallel surfaces, first electrode portions disposed on said first surface correspondingly to said electrodes of said semiconductor chip and second electrode portions disposed on said second surface and electrically communicating with said first electrode portions, said package substrate being fixed to said semiconductor chip in such a positional relationship that the main surface of said semiconductor chip faces to said first surface, and having substantially the same size as said semiconductor chip as viewed on a projection plane vertical to said first surface; and
    bumps disposed between said electrodes of said semiconductor chip and said first electrode portions corresponding to said electrodes for bonding them.

3. A semiconductor package according to claim 2, wherein said package substrate has a protruding portion protruding outward an outer peripheral portion of said semiconductor chip as viewed on said projection plane.

4. A semiconductor package according to claim 2, wherein said package substrate has a protruding portion protruding outward an outer peripheral portion of said semiconductor chip as viewed on said projection plane, and said protruding portion has a thickness greater than a thickness of a portion of said package substrate facing the main surface of said semiconductor chip.

5. A semiconductor package according to claim 2, wherein each of said first electrode portions is electrically connected to one of said second electrode portions through a through-hole formed in said package substrate.

6. A semiconductor package according to claim 2, wherein each of said first electrode portions is electrically connected to one of said second electrode portions by a conductor extending on an outer periphery of said package substrate.

7. A semiconductor package comprising:
    a semiconductor chip having a plurality of electrodes on a main surface thereof;
    a package substrate having first and second parallel surfaces, first electrode portions disposed on said first surface correspondingly to said electrodes of said semiconductor chip and second electrode portions disposed on said second surface and electrically communicating with said first electrode portions, said package substrate being fixed to said semiconductor chip in such a positional relationship that the main surface of said semiconductor chip faces said first surface, and having a size substantially equal to a size of said semiconductor chip as viewed on a projection plane vertical to said first surface;
    bumps disposed between said electrodes of said semiconductor chip and said first electrode portions corresponding to said electrodes for bonding them; and
    molding means including a resin material for molding at least an outer peripheral portion of a gap between said semiconductor chip and said package substrate.

8. A semiconductor package according to claim 7, wherein said package substrate has a protruding portion protruding outward an outer peripheral portion of said semiconductor chip as viewed on said projection plane, and said protruding portion has a thickness greater than a thickness of a portion of said package substrate facing said main surface of said semiconductor chip.

9. A semiconductor package according to claim 7, wherein each of said first electrode portions is electrically connected to one of said second electrode portions through a through-hole formed in said package substrate.

10. A semiconductor package according to claim 7, wherein each of said first electrode portions is electrically connected to one of said second electrode portions by a conductor extending on an outer periphery of said package substrate.

11. A semiconductor package comprising:
    a semiconductor chip having a plurality of electrodes on a main surface thereof;
    a package substrate having first and second parallel surfaces and a plurality of openings formed correspondingly to said electrodes of said semiconductor chip to extend between said first surface and said second surface, said package substrate being fixed to said semiconductor chip in such a positional relationship that said main surface of said semiconductor chip faces said first surface and said electrodes of said semiconductor chip are exposed inside said openings, and having a size substantially equal to a size of said semiconductor chip as viewed on a projection plane vertical to said first surface; and a bonding layer disposed between said semiconductor chip and said package substrate for bonding them each other.

12. A semiconductor package according to claim 11, wherein said package substrate has a protruding portion protruding outward an outer peripheral portion of said semiconductor chip as viewed on said projection plane, and said protruding portion has a thickness greater than a thickness of a portion of said package substrate facing said main surface of said semiconductor chip.

13. A semiconductor package according to claim 11, wherein at least one of a plurality of said openings has a size sufficient to allow at least two of said electrodes of said semiconductor chip to be exposed inside the opening.

14. A semiconductor package comprising:

a semiconductor chip having a plurality of electrodes on a main surface thereof;

a package substrate having first and second parallel surfaces and a plurality of openings formed correspondingly to said electrodes of said semiconductor chip to extend between said first surface and said second surface, said package substrate being fixed to said semiconductor chip in such a positional relationship that said main surface of said semiconductor chip faces said first surface and said electrodes of said semiconductor chip are exposed inside said openings, and having a size substantially equal to a size of said semiconductor chip as viewed on a projection plane vertical to said first surface;

a bonding layer disposed between said semiconductor chip and said package substrate, for bonding them one another; and molding means including a resin material for molding at least an outer peripheral portion of a gap between said semiconductor chip and said package substrate.

15. A semiconductor package according to claim 14, wherein said package substrate has a protruding portion protruding outward an outer peripheral portion of said semiconductor chip as viewed on said projection plane, and said protruding portion has a thickness greater than a thickness of a portion of said package substrate facing said main surface of said semiconductor chip.

16. A semiconductor package according to claim 14, wherein at least one of a plurality of said openings has a size sufficient to allow at least two of said electrodes of said semiconductor chip to be exposed inside the opening.

17. A method of mounting a semiconductor package to a circuit board wherein said semiconductor package comprises a semiconductor chip having a plurality of electrodes on a main surface thereof; and a package substrate having first and second parallel surfaces, first electrode portions disposed on said first surface correspondingly to said electrodes of said semiconductor chip, and second electrode portions disposed on said second surface and electrically communicating with said first electrode portions, said package substrate being fixed to said semiconductor chip in such a positional relationship that the main surface of said semiconductor chip faces said first surface, and having a size substantially equal to a size of said semiconductor chip as viewed on a projection plane vertical to said first surface; said method comprising the steps of:

fixing a rear surface of said semiconductor chip opposing to said main surface to said circuit board; and electrically connecting said second electrode portions disposed on said second surface of said package substrate to predetermined portions of said circuit board by bonding wires.

18. A method of mounting a semiconductor package to a circuit board wherein said semiconductor package comprises a semiconductor chip having a plurality of electrodes on a main surface thereof; a package substrate having first and second parallel surfaces, first electrode portions disposed on said first surface correspondingly to said electrodes of said semiconductor chip, and second electrode portions disposed on said second surface and electrically communicating with said first electrode portions, said package substrate being fixed to said semiconductor chip in such a positional relationship that said main surface of said semiconductor chip faces said first surface, and having a size substantially equal to a size of said semiconductor chip as viewed on a projection plane vertical to said first surface; and molding means including a resin material for molding an outer peripheral portion surrounding at least a gap between said semiconductor chip and said package substrate; said method comprising the steps of:

fixing a rear surface of said semiconductor chip opposing to said main surface to said circuit board; and electrically connecting said second electrode portions disposed on said second surface of said package substrate to predetermined portions of said circuit board by bonding wires.

19. A method of mounting a semiconductor package to a circuit board wherein said semiconductor package comprises a semiconductor chip having a plurality of electrodes on a main surface thereof; and a packaging substrate having first and second parallel surfaces, first electrode portions disposed on said first surface correspondingly to said electrode of said semiconductor chip and second electrode portions disposed on said second surface and electrically communicating with said first electrode portions, said package substrate being fixed to said semiconductor chip in such a positional relationship that said main surface of said semiconductor chip faces said first surface, and having substantially the same size as said semiconductor chip as viewed on a projection plane vertical to said first surface; said method comprising the steps of:

fixing a rear surface of said semiconductor chip opposing to said main surface to said circuit board;

disposing bumps to said second electrode portions on said second surface of said package substrate, respectively;

disposing said second surface of said package substrate in such a positional relationship that said second electrode portions face predetermined portions of said circuit board; and bonding said second electrode portions to said predetermined portions of said circuit board through said bumps.

20. A method of mounting a semiconductor package to a circuit board wherein said semiconductor package comprises a semiconductor chip having a plurality of electrodes on a main surface thereof; a package substrate having first and second parallel surfaces, first electrode portions disposed on said first surface correspondingly to said electrodes of said semiconductor chip, and second electrode portions disposed on said second surface and electrically communicating with said first electrode portions, said package substrate being fixed to said semiconductor chip in such a positional relationship that said main surface of said semiconductor chip faces said first surface, and having a size substantially equal to a size of said semiconductor chip as viewed on a projection plane vertical to said first surface;

and molding means including a resin material for molding an outer peripheral portion surrounding at least a gap between said semiconductor chip and said package substrate; said method comprising the steps of:

disposing bumps to said second electrode portions on said second surface of said package substrate, respectively;

disposing said second surface of said package substrate in such a positional relationship that said seined electrode portions face predetermined portions of said circuit board; and bonding said second electrode portions to said predetermined portions of said circuit board through said bumps.

21. A method of mounting a semiconductor package to a circuit board wherein said semiconductor package comprises a semiconductor chip having a plurality of electrodes on a main surface thereof; a package substrate having first and second parallel surfaces and a plurality of openings formed correspondingly to said electrodes of said semiconductor chip to extend between said first surface and said second surface, said package substrate being fixed to said semiconductor chip in such a positional relationship that said main surface of said semiconductor chip faces said first surface and said electrodes of said semiconductor chip are exposed inside said openings, and having a size substantially equal to a size of said semiconductor chip as viewed on a projection plane vertical to said first surface; and a bonding layer for bonding said semiconductor chip to said package substrate; said method comprising the steps of:

fixing a rear surface of said semiconductor chip opposing to said main surface to said circuit board; and electrically connecting said electrodes of said semiconductor chip exposed inside said openings of said package substrate to predetermined portions of said circuit board by bonding wires.

22. A method of mounting a semiconductor package to a circuit board wherein said semiconductor package comprises a semiconductor chip having a plurality of electrodes on a main surface thereof; a package substrate having first and second parallel surfaces and a plurality of openings formed correspondingly to said electrodes of said semiconductor hip to extend between said first surface and said second surface, said package substrate being fixed to said semiconductor chip in such a positional relationship that said main surface of said semiconductor chip faces said first surface and said electrodes of said semiconductor chip are exposed inside said openings, and having a size substantially equal to a size of said semiconductor chip as viewed on a projection plane vertical to said first surface; and a bonding layer for bonding said semiconductor hip to said package substrate; said method comprising the steps of:

fixing a rear surface of said semiconductor chip opposing to said main surface to said circuit board; and electrically connecting said electrodes of said semiconductor chip exposed inside said openings of said package substrate to predetermined portions of said circuit board by bonding wires.

\* \* \* \* \*